United States Patent
Miyashita et al.

(10) Patent No.: US 7,194,815 B2
(45) Date of Patent: Mar. 27, 2007

(54) DEVICE FOR DETECTING MAGNETIC AZIMUTH

(75) Inventors: Shinichi Miyashita, Yamanashi-ken (JP); Makoto Kawakami, Osaka (JP)

(73) Assignees: Citizen Electronics Co., Ltd., Yamanashi-ken (JP); Neomax Co., Ltd, Osaka (JP)

( * ) Notice: Subject to any disclaimer, the term of this patent is extended or adjusted under 35 U.S.C. 154(b) by 0 days.

(21) Appl. No.: 10/956,150

(22) Filed: Oct. 4, 2004

(65) Prior Publication Data

US 2005/0072011 A1   Apr. 7, 2005

(30) Foreign Application Priority Data

Oct. 6, 2003   (JP) .............................. 2003-347663

(51) Int. Cl.
*G01C 17/02* (2006.01)

(52) U.S. Cl. .................. 33/355 R; 33/356; 33/273

(58) Field of Classification Search ............. 33/355 R, 33/356, 333, 361, 273, 310, 313
See application file for complete search history.

(56) References Cited

U.S. PATENT DOCUMENTS

| | | | | |
|---|---|---|---|---|
| 5,564,194 A | * | 10/1996 | Fujita et al. .............. | 33/355 R |
| 5,747,997 A | * | 5/1998 | Dahlberg et al. ......... | 33/355 R |
| 5,982,176 A | * | 11/1999 | Kawamura et al. ....... | 33/355 R |
| 6,536,123 B2 | * | 3/2003 | Tamura ..................... | 33/356 |
| 6,539,639 B2 | * | 4/2003 | Smith ........................ | 33/356 |
| 6,606,799 B2 | * | 8/2003 | Kato ......................... | 33/356 |
| 6,826,842 B2 | * | 12/2004 | Abe et al. ................. | 33/355 R |
| 6,883,241 B2 | * | 4/2005 | Moskowitz et al. ...... | 33/355 R |
| 2002/0014016 A1 | * | 2/2002 | Kato ......................... | 33/355 R |
| 2004/0038510 A1 | * | 2/2004 | Munakata et al. ......... | 438/613 |
| 2004/0111906 A1 | * | 6/2004 | Abe et al. ................. | 33/355 R |
| 2005/0016006 A1 | * | 1/2005 | Sasagawa .................. | 33/355 R |

* cited by examiner

*Primary Examiner*—Yaritza Guadalupe-McCall
(74) *Attorney, Agent, or Firm*—Dennison, Schultz & MacDonald

(57) ABSTRACT

There is provided a quadrilateral insulating substrate, and plural magnetic sensors are provided on the substrate. An IC is provided on the substrate for supplying driving signals to the magnetic sensors and receiving magnetic detecting signals from the magnetic sensors to output magnetic information depending on strength of magnetism. The magnetic sensors and the IC are encapsulated by an encapsulation member to integrate the substrate and magnetic sensors and IC.

9 Claims, 8 Drawing Sheets

DEVICE FOR DETECTING MAGNETIC AZIMUTH

BACKGROUND OF THE INVENTION

The present invention relates to a device for detecting earth's magnetism, and more particularly to a device for detecting magnetic azimuth using a flux-gate sensor.

Heretofore, an azimuth detecting device for detecting the azimuth by measuring the earth's magnetism is widely used as an azimuth information complemental means in navigation system such as for cars, portable information equipment such a portable telephone, a PDA and so on. In the azimuth detecting device, the flux-gate magnetic sensor using a toroidal core having high sensitivity is generally used, and an azimuth detecting device having high accuracy is proposed in Japanese Patent Laid Open 6-50757.

The disclosed conventional device is provided with a flux-gate magnetic sensor comprising a toroidal core having an exciting coil and an axis in the Z-direction, an X-direction detecting coil having an axis in the X-direction, and a Y-direction detecting coil having an axis in the Y-direction. The device is characterized in that a gain setting circuit is provided for setting gains which are different in accordance with ranges of azimuth. Therefore, if a detected signal has an error in direction due to the variations in the sectional area of the toroidal core, the detected signal can be corrected by the gain setting circuit. Thus, azimuth detection of high accuracy can be realized.

However, in the proposed azimuth detecting device, since there is provided the toroidal core and two detecting coils surrounding the toroidal core, it is difficult to miniaturize the device. Therefore, the device is unsuitable to be mounted in the portable information equipment such as a portable telephone, a PDA, and so on, the demand of which has increased rapidly in recent years. In addition, the mounting of the gain setting circuit causes the signal processing circuit to be complicated. Hence there are fears about increase of the equipment mounting area and the manufacturing cost.

Under such a situation, a miniaturized magnetic azimuth detecting device is proposed in Japanese Patent Laid Open 2002-243818.

In the geomagnetic azimuth detecting device, a magnetic detecting portion is formed by superimposing a plurality of substrates, interposing a toroidal core formed by an amorphous core. The block of the substrates comprises an exciting coil substrate, an X-direction magnetic detecting coil substrate, and a Y-direction magnetic detecting coil substrate.

There is provided a signal processing circuit which comprises a first analogue switch, second analogue switch, first integrated circuit for integrating the output of the first analogue switch, second integrated circuit for integrating the output of the second analogue switch, difference amplifier for amplifying the difference between the output of the first integrated circuit and the output of the second integrated circuit and an A/D converter for converting the output of the difference amplifier into a digital signal.

Since the exciting coil wound on the toroidal core and two coils of X and Y directions are formed by the superimposed substrates, the magnetic azimuth detecting device may be miniaturized, thereby enabling the mounting of the device in a portable information equipment.

However, since the device is provided with the circular toroidal core, there is a limit on downsizing of the device. On the other hand, although the toroidal core is made of an amorphous material, the amorphous material is liable to be magnetized because of large coercive force, so that the detected value is apt to have an error due to a hysteresis. Furthermore, it is necessary to provide analogue switches and the difference amplifier in the detecting circuit, which renders the circuit composition complicated and the manufacturing cost increased. In addition, driving current of several ten milliamperes is necessary for magnetic saturation of the toroidal core. Consequently, there are problems in mounting the device on the portable electronic equipment from the point of power consumption. In particular, in order to realize a headup display on the portable telephone with a GPS, it is required that the geomagnetic azimuth detecting device is further downsized and the power consumption is more decreased.

SUMMARY OF THE INVENTION

An object of the present invention is to provide a magnetic azimuth detecting device which has a very small size, low power consumption, and high detecting accuracy.

A magnetic azimuth detecting device according to the present invention comprises a generally quadrilateral insulating substrate, plural magnetic sensors provided on the substrate, an IC provided on the substrate for supplying driving signals to the magnetic sensors and receiving magnetic detecting signals from the magnetic sensors to output magnetic information depending on strength of magnetism, an encapsulation member encapsulating the magnetic sensors and the IC to integrate the substrate and magnetic sensors and IC.

Since the magnetic sensors and the IC for driving the magnetic sensors to obtain the magnetic information can be integrated, it is possible to provide a very small magnetic azimuth detecting device.

In accordance with another aspect of the present invention, a magnetic azimuth detecting device comprises a generally quadrilateral insulating substrate, plural magnetic sensors provided on the substrate, an IC provided on the substrate for supplying driving signals to the magnetic sensors and receiving magnetic detecting signals from the magnetic sensors to output magnetic information depending on strength of magnetism, an arithmetic calculation means provided on the substrate for calculating azimuth depending on the magnetic information, an encapsulation member encapsulating the magnetic sensors, the IC, and the arithmetic calculation means to integrate the substrate, magnetic sensors, IC, and arithmetic calculation means.

Since the arithmetic calculation means for calculating the azimuth based on the magnetic information is integrally provided, it is possible to directly obtain the digitized azimuth information. Therefore, the processing load of the portable information equipment provided with the magnetic azimuth detecting device is reduced, so that it is possible to realize an information equipment having excellent processing function.

The magnetic azimuth detecting device is characterized in that the magnetic sensors are disposed in an X-direction and a Y-direction of the substrate for detecting earth's magnetism in the X-direction and the Y-direction.

Since the earth's magnetism is detected by two axes, it is possible to detect the azimuth with a high degree of accuracy.

The magnetic azimuth detecting device is characterized in that each of the magnetic sensors is a flux-gate sensor having a core made of soft magnetic material.

Thus, it is possible to provide the magnetic azimuth detecting device having a small size, high accuracy and low power consumption.

The magnetic azimuth detecting device is characterized in that the substrate has a plurality of through-holes and terminal electrodes each of which is electrically connected to one of the corresponding through-holes, characterized in that the substrate is electrically connected to an outside substrate by surface mounting through the terminal electrodes.

By this composition, since the magnetic azimuth detecting device can be set on a substrate of a portable information equipment by surface mounting, it is possible to provide a magnetic azimuth detecting device having a small mounting area and being inexpensive in manufacturing cost.

A plurality of insulating substrates are formed on a substrate aggregation, and divided into independent substrate by dicing the substrate aggregation.

Since a plurality of magnetic sensors and ICs can be mounted on the substrate aggregation in a lump, it is possible to provide a magnetic azimuth detecting device excellent in mass productivity and having stable quality.

As described above, in accordance with the present invention, since the X-direction and Y-direction magnetic sensors and IC for driving the magnetic sensors to obtain magnetic information are integrated, it is possible to provide a magnetic azimuth detecting device having a small size and high performance.

These and other objects and features of the present invention will become more apparent from the following detailed description with reference to the accompanying drawings.

DETAILED DESCRIPTION OF THE PREFERRED EMBODIMENT

Figure 1:
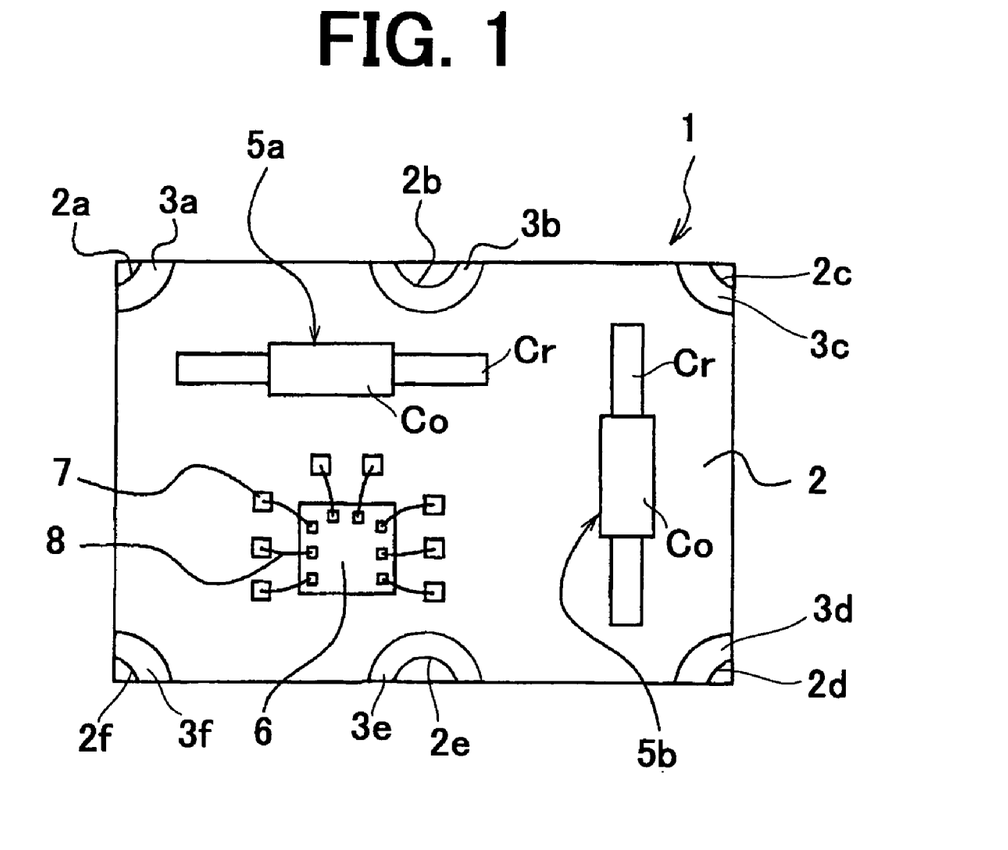
FIG. 1 is a plan view showing a magnetic azimuth detecting device according to a first embodiment of the present invention.
Figure 2:
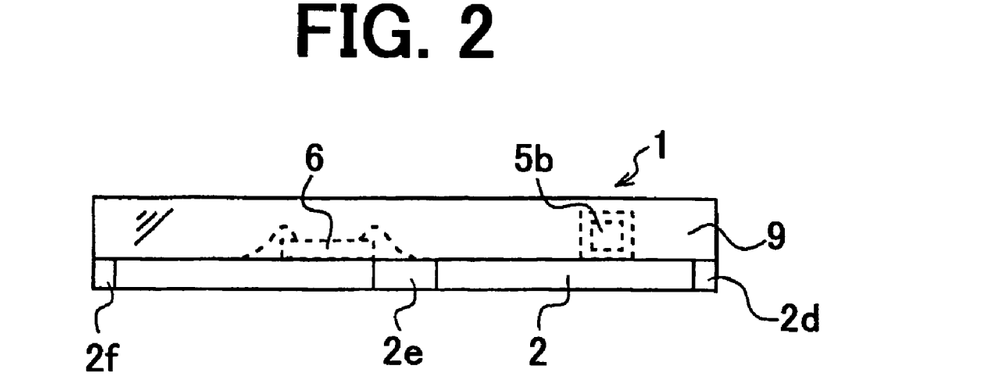
FIG. 2 is a side view of the device.
Figure 3:
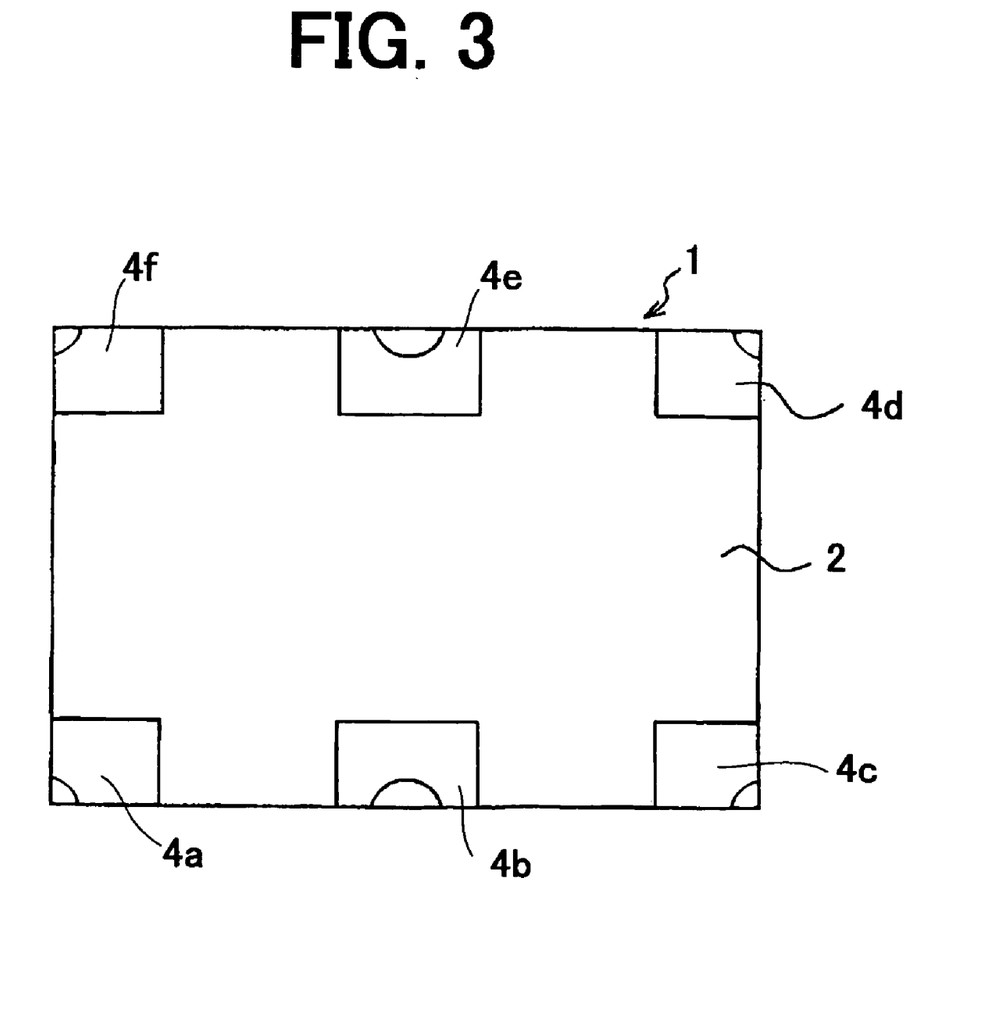
FIG. 3 is an underside view.
Figure 4:
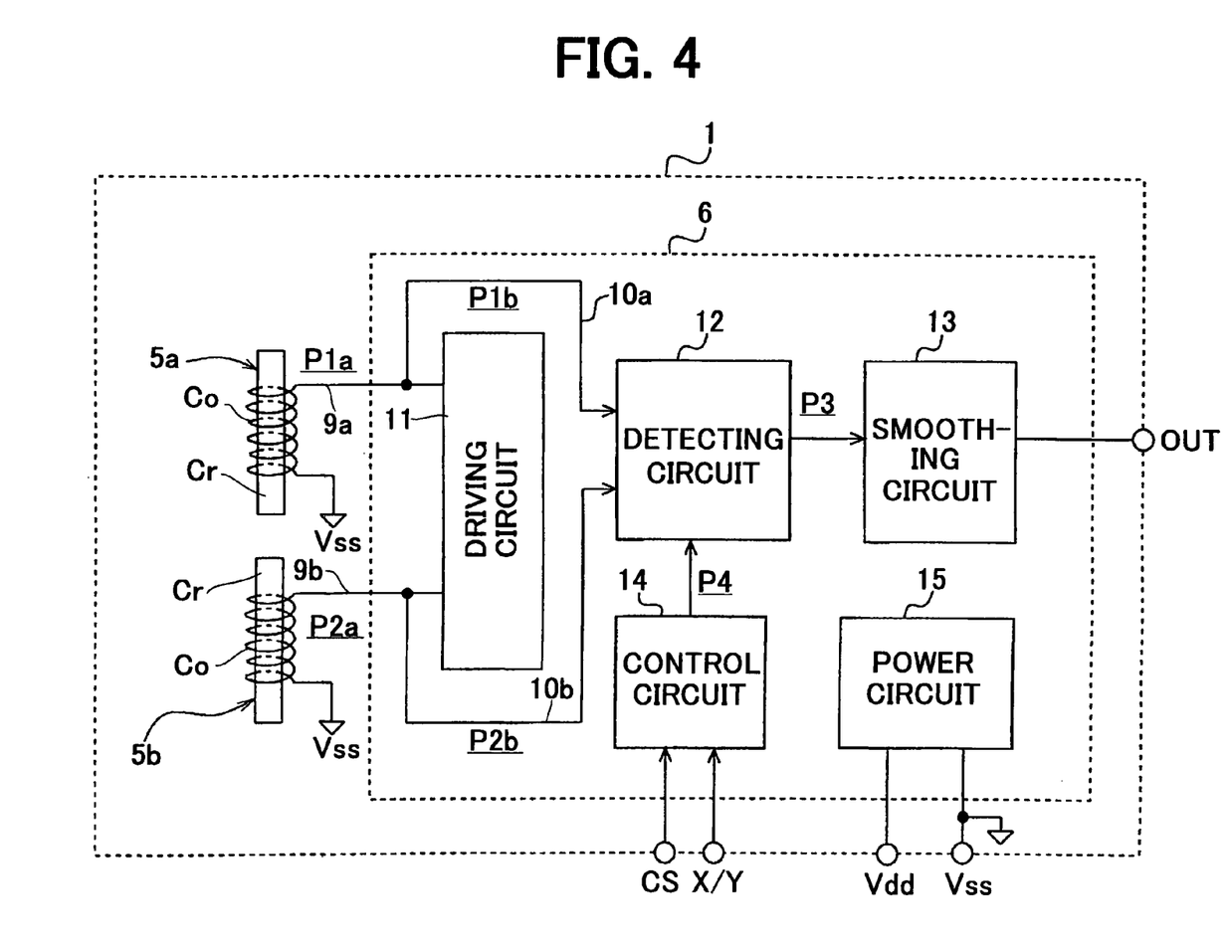
FIG. 4 is a block diagram showing a detecting circuit.
Figure 5:
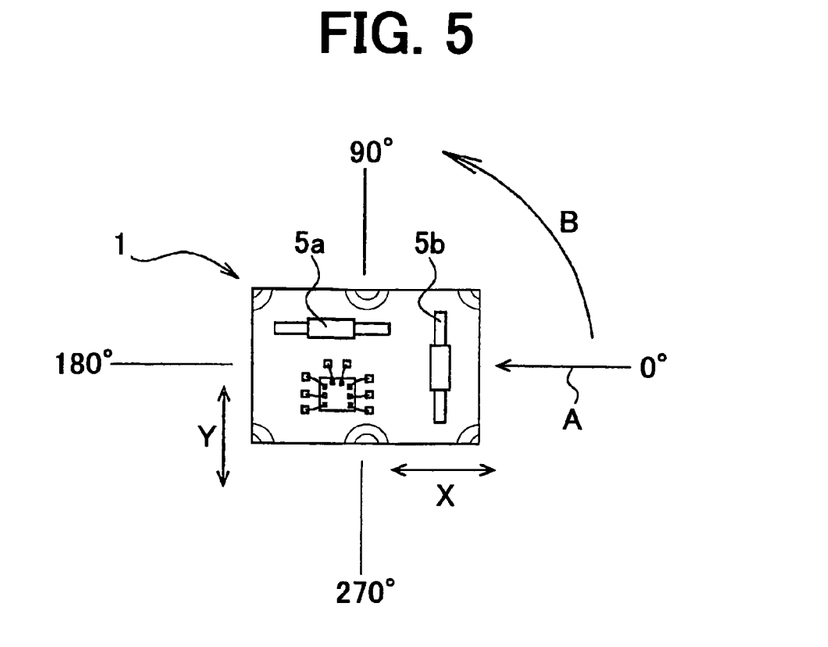
FIG. 5 is a plan view of the device for explaining a detecting operation.
Figure 6:
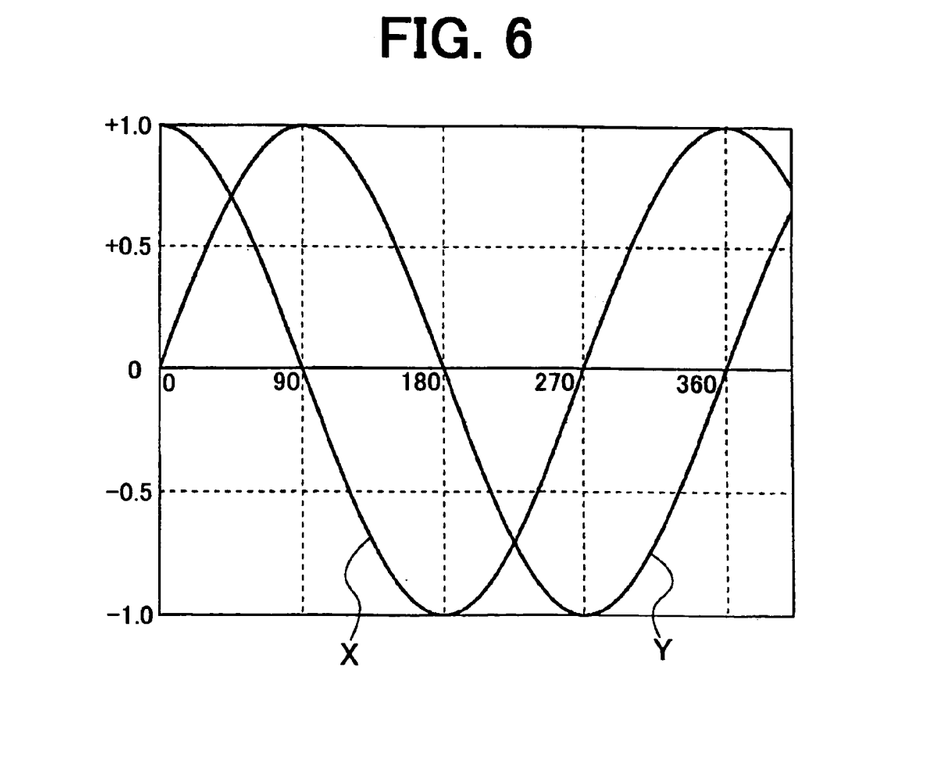
FIG. 6 is a diagram showing output characteristics.

FIG. 1 is a plan view showing a magnetic azimuth detecting device according to a first embodiment of the present invention, FIG. 2 is a side view of the device, FIG. 3 is an underside view, FIG. 4 is a block diagram showing a detecting circuit, FIG. 5 is a plan view of the device for explaining a detecting operation, and FIG. 6 is a diagram showing output characteristics.

Referring to FIGS. 1 to 3, a magnetic azimuth detecting device 1 of the present invention has a quadrilateral circuit substrate 2. The substrate 2 is preferable to be made of heat-resistant glass epoxy resin or ceramics and has a thickness of about 0.3 mm. On the four corners and opposite side walls of the substrate, through-holes $2a$ to $2f$ are formed. On the upper surface and lower surface of the substrate, upper electrodes $3a$ to $3f$ and lower electrodes $4a$ to $4f$ are mounted, surrounding the through-holes. Opposite upper electrode and lower electrode are electrically connected by a metal plate secured to the inside wall of each through-hole. The lower electrodes $4a$ to $4f$ are used for surface mounting the magnetic azimuth detecting device on a portable telephone with solder, gold bums, anisotropic conductive paste, or anisotropic conductive film.

There are mounted on the substrate 2, flux-gate magnetic sensors $5a$ and $5b$, each of which comprises a core Cr and a coil Co on the core. The core Cr is formed by permalloy foil of soft magnetic material. The sensor is an improvement of the sensor disclosed in the Japanese Patent Laid Open 2004-184098, the patent application of which was filed by the applicant of this patent application.

As another conventional sensor, there is provided Japanese Patent Laid open 2001-330655.

The magnetic sensor $5a$ is mounted on the substrate 2, disposed in the X-direction and secured to the substrate with solder, gold bums, anisotropic conductive paste, or anisotropic conductive film. The magnetic sensor $5b$ is mounted on the substrate 2, disposed in the Y-direction and secured to the substrate with solder. Further, mounted on the substrate 2 is a driving and detecting IC 6 which is hereinafter called detecting IC and described in detail. A plurality of electrodes are provided on the detecting IC and connected to IC connecting electrodes 7 on the substrate 2 by wires 8. The electrical connection of the detecting IC 6 to the electrodes 7 is not limited to the wire bonding. For example, the detecting IC 6 may be mounted on electrodes 7 by flip chip mounting using solder, gold bumps, or anisotropic conductive material. The magnetic sensors $5a$, $5b$, and the detecting IC 6 are encapsulated by a transparent encapsulating resin 9.

Although wiring patterns are formed on the substrate 2 by copper foil or gold foil, the wiring patterns are not depicted in FIG. 1.

Next, the detecting circuit composition of the magnetic azimuth detecting device of the present invention will be described with reference to FIG. 4. The detecting IC 6 has a driving circuit 11, a detecting circuit 12, and a control circuit 14. An end of the coil Co of the magnetic sensor $5a$ is connected to the driving circuit 11 by a wire $9a$, and an end of the coil Co of the magnetic sensor $5b$ is connected to the driving circuit 11 by a wire $9b$. The other end of each coil Co is connected to a negative electrode Vss. The detecting circuit 12 is connected to the sensors $5a$, $5b$ by wires $10a$ and $10b$.

The driving circuit 11 applies driving signals P1$a$ and P2$a$ to the coil Co of the sensors $5a$ and $5b$ to drive the sensors. The detecting circuit 12 receives magnetic detecting signals P1$b$ and P2$b$ from the magnetic sensors $5a$ and $5b$ to output a magnetic signal P3.

The magnetic signal P3 is fed to a smoothing circuit 13 to be converted to an analogue signal. The analogue signal is output from the smoothing circuit 13 as a magnetism information. A smoothing capacitor of the smoothing circuit 13 is disposed outside the detecting IC 6.

The control circuit 14 is applied with a selection signal CS and a control signal X/Y from an outside member to feed a changeover signal P4 to the detecting circuit 12. A power circuit 15 is applied with positive voltage Vdd and negative voltage Vss to apply necessary voltage to circuit blocks. Terminals OUT, CS, X/Y, Vdd and Vss are connected to electrodes selected from lower electrodes 4a to 4f shown in FIG. 1.

The operation of the magnetic azimuth detecting device will be described hereinafter with reference to FIGS. 4, 5 and 6.

Referring to FIG. 4, when the positive voltage Vdd and negative voltage Vss are supplied to the power circuit 15, the power circuit 15 applies necessary voltage to the circuit blocks. In response to the voltage, the driving circuit 11 feeds the driving signals P1a and P2a to the magnetic sensors 5a and 5b. Each of the driving signals P1a and P2a is a triangle wave alternating current. Each of the magnetic sensors 5a and 5b superimposes the magnetic field of the triangle wave on the magnetic field of the detecting direction, namely X-direction or Y-direction. Consequently, signal levels of magnetic detecting signals P1b and P2b change in accordance with outside magnetic field, namely, the earth's magnetism.

The detecting circuit 12 detects change of signal levels of the X-direction magnetic detecting signal P1b and the Y-direction magnetic detecting signal P2b and produces the magnetic signal P3 of a rectangular wave signal. The duty ratio of the magnetic signal P3 varies with the change of the earth's magnetism.

The control circuit 14 outputs a changeover signal P4 in response to the control signal X/Y when the selection signal CS becomes active. The detecting circuit 12 changes magnetic detecting signals P1b and P2b in accordance with the changeover signal P4. More particularly, at a time in time division, the detecting circuit 12 outputs an X-direction magnetic signal P3 in response to the X-direction magnetic detecting signal P1b, and at a next time, outputs Y-direction magnetic signal P3 in accordance with the Y-direction magnetic detecting signal P2b. The smoothing circuit 13 converts the magnetic signal P3 of the rectangular wave signal to direct current voltage. Thus, an output signal OUT is output, the voltage of which changes with the strength of the earth's magnetism.

Next, the output characteristic of the magnetic azimuth detecting device 1 will be described with reference to FIGS. 5 and 6.

Referring to FIG. 5, the X-direction of the magnetic azimuth detecting device 1 is set at a position of zero degrees with respect to the earth's magnetism direction A, namely approximately north direction. Next, as described above, power is supplied to the magnetic azimuth detecting device 1 to activate the selection signal CS, so that the detecting circuit 12 detects the earth's magnetism of X-direction and Y-direction in accordance with the control signal X/Y. At that time, since the magnetic sensor 5a disposed in the X-direction is positioned at zero degrees with respect to the earth's magnetism A, the sensitivity to the earth's magnetism is maximum, and hence the output signal OUT in the X-direction is at maximum level. To the contrary, since the magnetic sensor 5b disposed in the Y-direction is positioned at 90° with respect to the earth's magnetism A, the sensitivity to the earth's magnetism is minimum, and the output signal OUT in the Y-direction is at minimum level.

When the magnetic azimuth detecting device 1 is rotated 90° in the arrow B direction, the magnetic sensor 5a disposed in the X-direction is positioned at 90° with respect to the earth's magnetism A. Therefore, the sensitivity to the earth's magnetism is minimum, and the output signal OUT in the X-direction is at minimum level. On the other hand, since the magnetic sensor 5b disposed in the Y-direction is positioned at zero degrees with respect to the earth's magnetism A, the sensitivity to the earth's magnetism is maximum, and hence the output signal OUT in the Y-direction is at maximum level.

FIG. 6 is a graph of the output signals OUT of the magnetic sensors 5a and 5b, which are obtained by plotting the output signals at predetermined rotation angle when the magnetic azimuth detecting device 1 is rotated with respect to the earth's magnetism A from the zero degrees in the arrow B direction. In the graph, X-axis designates the rotation angle of the magnetic azimuth detecting device 1 with respect to the earth's magnetism A, and the Y-axis shows relative output levels of the output signal OUT.

Explaining the X-direction output signal OUT detected by the X-direction magnetic sensor 5a, the output signal OUT has a maximum value at the zero degrees with respect to the earth's magnetism A as described above, and becomes minimum value at 90°. When the device 1 is further rotated in the B-direction to 180° position, the direction of the earth's magnetism A for the magnetic sensor 5a is the opposite direction to the direction at the zero degrees. Therefore, the output signal OUT becomes a negative maximum value, and becomes zero as a minimum value at 270°, since the position is the same as the 90° position. When the device 1 is further rotated to the 360° position, which is the same position as at the zero degrees, the output signal OUT becomes a positive maximum value.

In the Y-direction output signal OUT detected by the Y-direction magnetic sensor 5b, the output signal OUT has a minimum value of zero at the zero degrees with respect to the earth's magnetism A, and becomes positive value at 90°. When the device 1 is further rotated in the B-direction to 180° position, the output signal OUT becomes a minimum value zero. When the device is further rotated to 270° position, the earth's magnetism A for the magnetic sensor 5b is the opposite direction to the direction at 90° degrees. Therefore, the output signal OUT becomes negative maximum value. When the device 1 is further rotated to 360° position, the output signal OUT becomes zero, equal to the initial rotation angle, zero degrees.

Actual output voltage of the output signal OUT receives influence of magnetic field held in portable equipments. Therefore, it is necessary to cancel a voltage offset by the magnetic field by preliminarily performing calibration.

The graph of FIG. 6 shows the maximum values of the output signal OUT by setting the maximum values in the positive direction and negative direction to the plus 1 and minus 1 as relative values, although the maximum value of the output signal OUT depends on the horizontal component of the detected earth's magnetism. Thus, by finding values of the X-direction output signal OUT and the Y-direction output signal OUT of the magnetic azimuth detecting device 1, it is possible to know the rotation angle of the magnetic azimuth detecting device 1 with respect to the earth's magnetism A. As a result, the azimuth of the magnetic azimuth detecting device 1 based on the earth's magnetism A can be known.

In accordance with the present invention, the magnetic sensors 5a and 5b and the detecting IC 6 for driving the magnetic sensors to detect the magnetism are integrally mounted on the circuit substrate 2. The size of the magnetic sensor disclosed in the Japanese Patent Laid Open 2004-184098 is very small, as length in the longitudinal direction of 3 mm, width of 0.3 mm, and thickness of 0.4 mm. Therefore, by using the magnetic sensor as the magnetic sensors 5a and 5b, it is possible to realize a magnetic azimuth detecting device having an external size smaller than 4.5 mm×4 mm and the height of 1 mm. Furthermore, it is possible to reduce the external size of the magnetic sensors 5a and 5b to length in longitudinal direction of 2 mm, width of 0.3 mm, thickness of 0.4 mm. In this case, it is possible to realize the reduction of the external size of the magnetic azimuth detecting device smaller than 3 mm×3 mm and height of 1 mm.

Since the core Cr of magnetic sensors 5a and 5b use permalloy foil having small volume, the sensors can be magnetically saturated by low driving current. Thus, it is possible to detect the earth's magnetism by high sensitivity at small power consumption. Further, since the permalloy has small coercive force, error in magnetizing is small. Therefore, it is possible to detect feeble earth's magnetism at high accuracy. Thus, the magnetic azimuth detecting device can be easily mounted in a portable telephone having GPS function. Consequently, the magnetic azimuth detecting device is optimum as a device for realizing a headup display.

Figure 7:
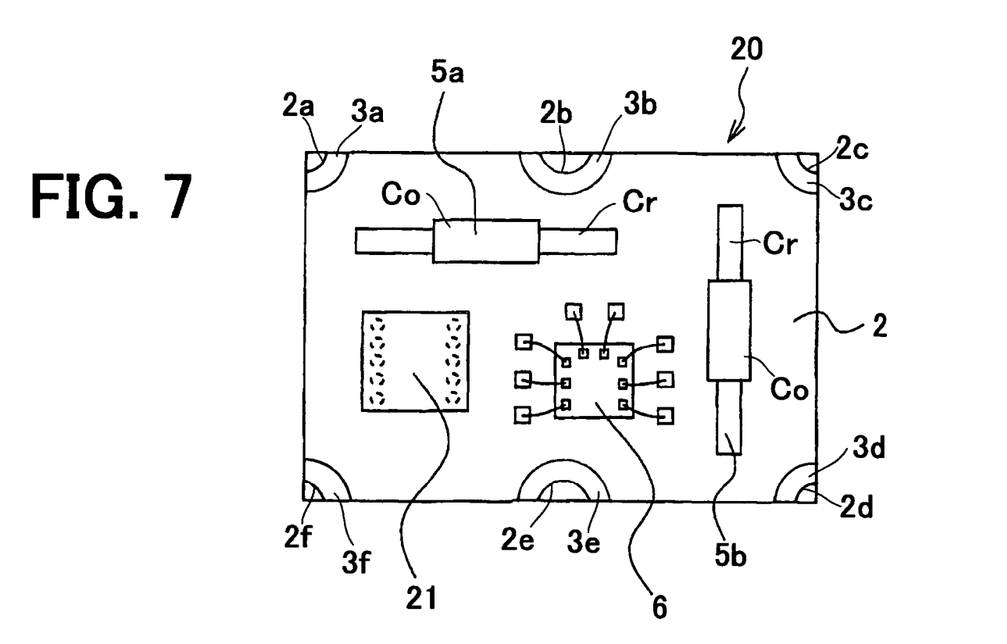
FIG. 7 is a plan view showing a magnetic azimuth detecting device according to a second embodiment of the present invention.
Figure 8:
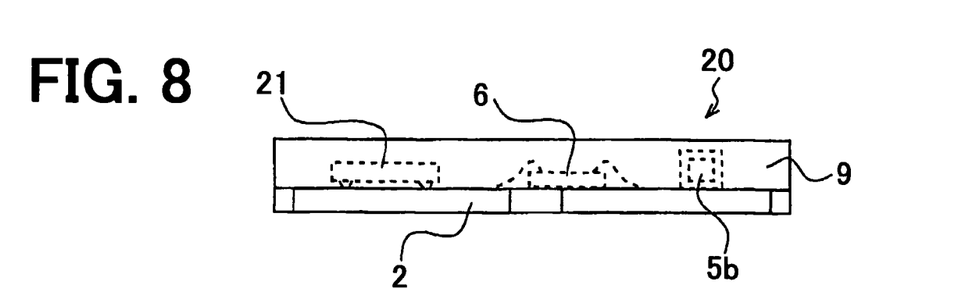
FIG. 8 is a side view of the device.
Figure 9:
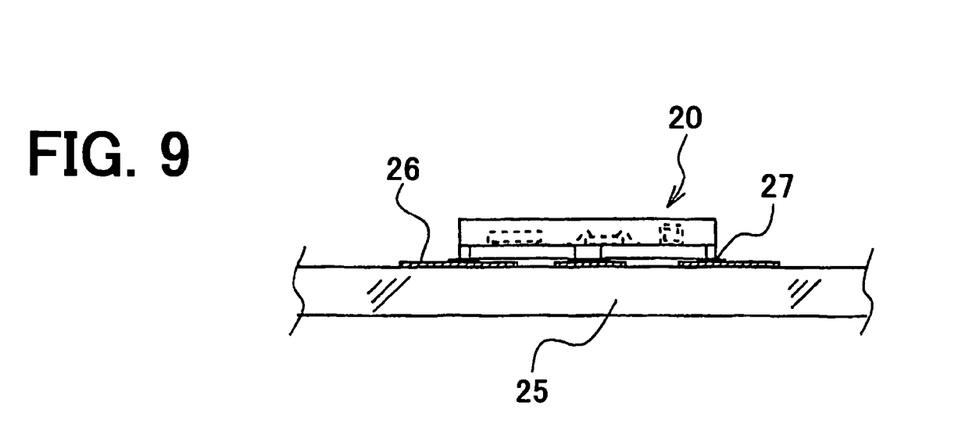
FIG. 9 is side view showing an actual device.
Figure 10:
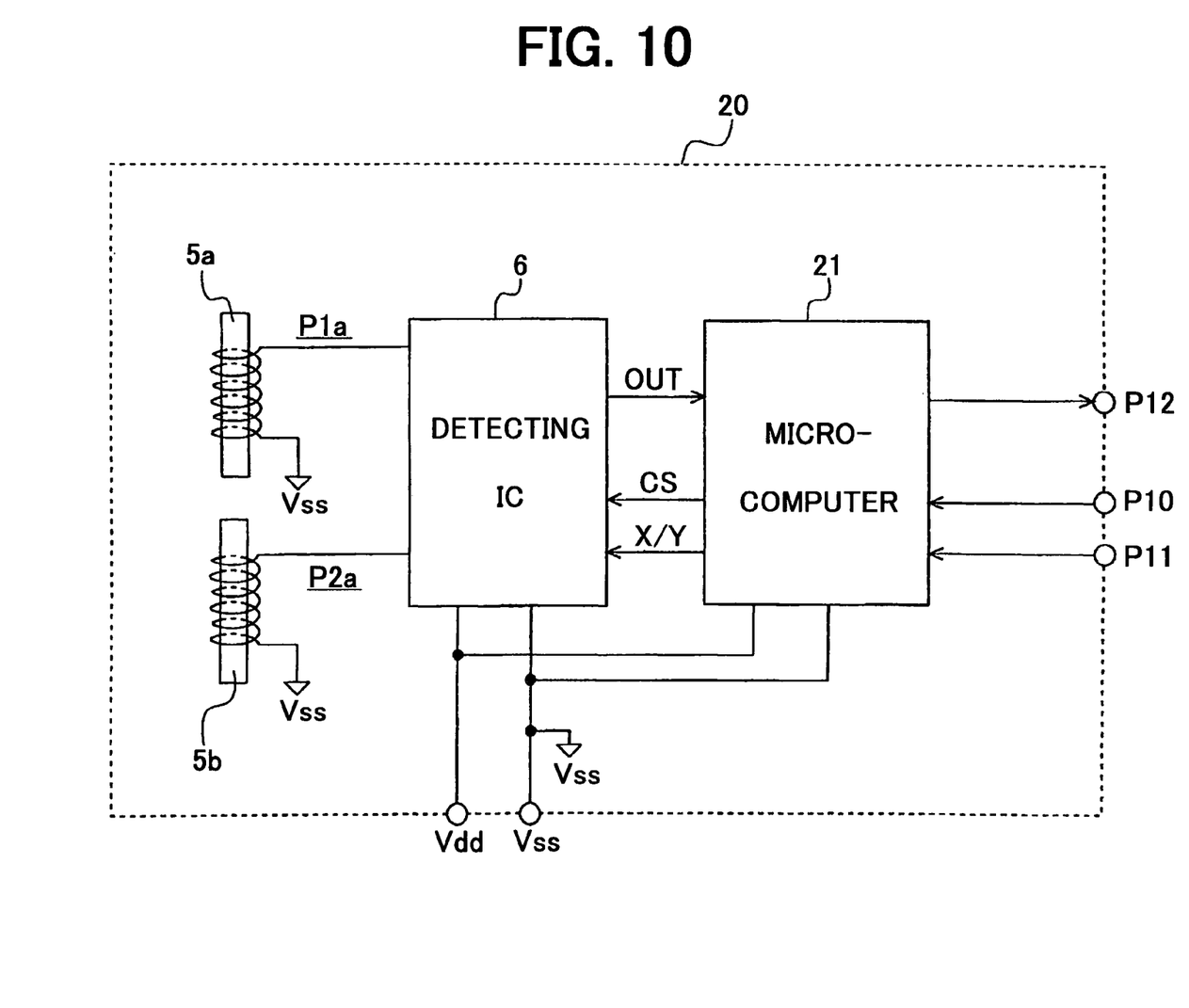
FIG. 10 is a block diagram showing a detecting circuit.
Figure 11:
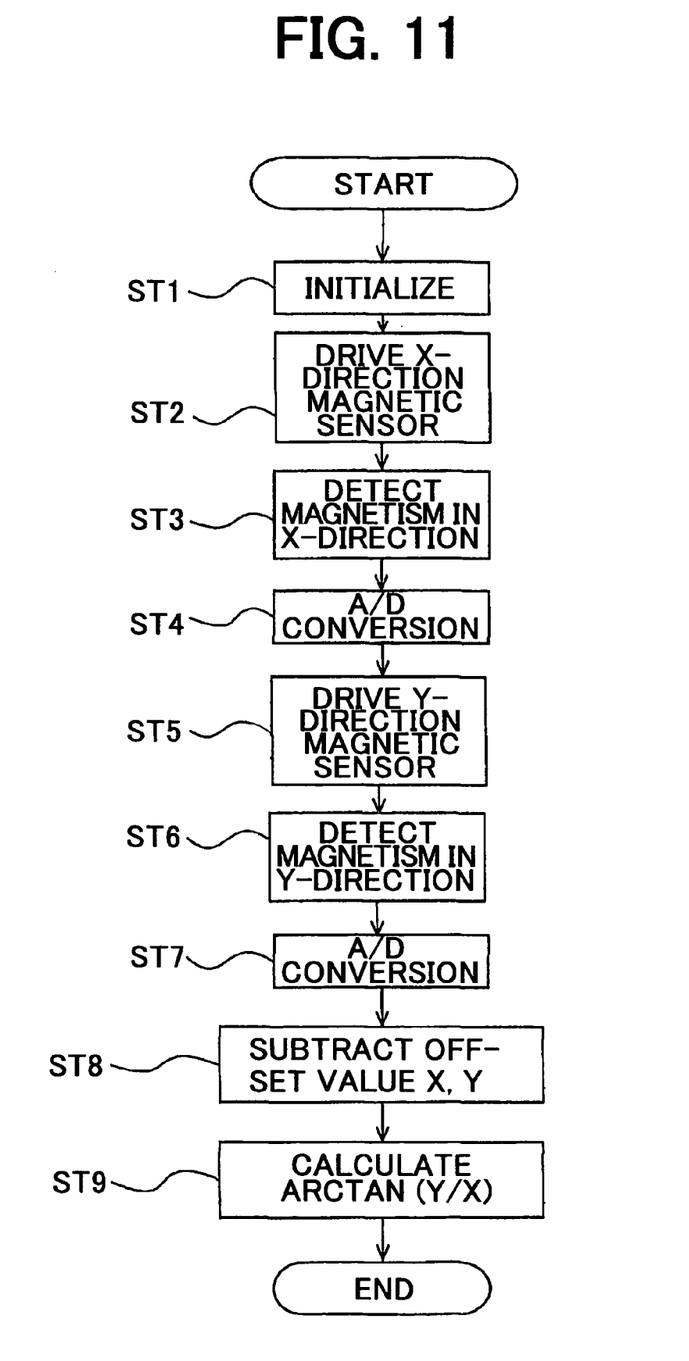
FIG. 11 is a flowchart showing the operation of the detecting device.

FIG. 7 is a plan view showing a magnetic azimuth detecting device according to a second embodiment of the present invention, FIG. 8 is a side view of the device, FIG. 9 is side view showing an actual device, FIG. 10 is a block diagram showing a detecting circuit, and FIG. 11 is a flowchart showing the operation of the detecting device.

The magnetic azimuth detecting device according to the second embodiment of the present invention will be explained with reference to the drawings. In the drawings, the same parts as the first embodiment are designated by the same reference numerals as the fist embodiment and a part of the explanation will be omitted.

Referring to FIGS. 7 to 9, a magnetic azimuth detecting device 20 of the present invention has the circuit substrate 2.

The magnetic sensor 5a is mounted on the substrate 2, disposed in the X-direction and secured to the substrate with solder. The magnetic sensor 5b is mounted on the substrate 2, disposed in the Y-direction and secured to the substrate with solder, gold bumps, or anisotropic conductive material.

A microcomputer 21 as a small arithmetic calculation means is mounted on the substrate 2, for example by the face down mounting. Thus, the microcomputer 21 is mounted on the substrate together with magnetic sensors 5a and 5b and detecting IC 6, and encapsulated by the encapsulating resin 9. The underside surface of the magnetic azimuth detecting device 20 is the same as that of FIG. 3 and hence the drawing is omitted.

Referring to FIG. 9 showing the actual device, there is provided an outside substrate which is a main substrate 25 provided in a portable information equipment such as a portable telephone. A plurality of conductive patterns 26 formed by copper foil are formed on the main substrate 25. Solder pastes 27 are painted on the conductive patterns 26, and the magnetic azimuth detecting device 20 is disposed on the solder pastes 27 and surface-mounted on the main substrate 25 by reflow soldering. Instead of solder pastes 27, anisotropic conductive material is also available. Thus, conductive patterns 26 and lower electrodes 4a to 4f (FIG. 3) are fixed by the solder pastes 27, thereby electrically and mechanically connecting the device 20 to the conductive patterns 26.

As described above, the magnetic sensors 5a and 5b, detecting IC 6 and microcomputer 21 are mounted on the substrate 2 and encapsulated by the encapsulating resin 9, thereby integrating the magnetic azimuth detecting device 20. The magnetic azimuth detecting device 20 is efficiently mounted on the main substrate 25 of the portable information equipment such as the portable telephone by the surface mounting.

Referring to FIG. 10 showing the detecting circuit of the magnetic azimuth detecting device 20 of the present invention, the detecting IC 6 applies driving signals P1a and P2a to the coil Co of the sensors 5a and 5b to drive the sensors. The detecting IC 6 outputs the output signal OUT and receives the control signal X/Y.

The microcomputer 21 has an A/D converter, arithmetic calculation circuit, and a memory circuit which are not shown, and receives command signals P10 and P11 from an outside, and outputs the selection signal CS and control signal X/Y.

The output signal OUT as magnetic information from the detecting IC 6 is inputted into microcomputer 21 which calculates magnetic azimuth and outputs azimuth data P12 as a digitized serial signal. Positive voltage Vdd and negative voltage Vss are applied to the detecting IC 6 and the microcomputer 21. The command signals P10 and P11, azimuth data 12, positive voltage Vdd, negative voltage Vss are applied to proper lower electrodes 4a to 4f (FIG. 3) by optimal combination.

The operation of the magnetic azimuth detecting device 20 will be described hereinafter with reference to FIGS. 10 and 11. When the positive voltage Vdd and negative voltage Vss are applied to the magnetic azimuth detecting device 20, initializing process of the microcomputer 21 is performed inside, so that the selection signal CS is non-activated and the detecting IC 6 is set in a standing mode (step ST1 in the flowchart of FIG. 11). When the microcomputer 21 receives an azimuth measuring command dependent on the command signals P10 and P11, the microcomputer 21 activates the selection signal CS to output the control signal X/Y. The detecting IC 6 becomes magnetic measuring mode by the selection signal CS, and outputs driving signal P1a by the control signal X/Y, so that the X-direction magnetic sensor 5a is driven (step ST2).

Next, the detecting IC 6 detects a magnetic detecting signal from the driven magnetic sensor 5a to output an output signal OUT indicating the magnetism in the X-direction (step ST3). Thereafter, the microcomputer 21 receives the output signal OUT to perform A/D conversion inside to produce a digitized X-data. The digitized X-data is stored in an internal memory circuit (step ST4). Next, the microcomputer 21 changeovers the control signal X/Y, so that the detecting IC 6 outputs driving signal P2a by the control signal X/Y, thereby driving the Y-direction magnetic sensor 5b (step ST5).

Next, the detecting IC 6 detects a magnetic detecting signal from the driven magnetic sensor 5b to output an output signal OUT indicating the magnetism in the Y-direction (step ST6). Thereafter, the microcomputer 21 receives the output signal OUT to perform A/D conversion inside to produce a digitized Y-data. The digitized Y-data is stored in an internal memory circuit (step ST7).

Next, the microcomputer 21 subtracts the offset value from the stored X-data and Y-data, due to the held magnetic field in the portable electronic equipment in which the magnetic azimuth detecting device is mounted, thereby canceling the error component dependent on the held magnetic field (step ST8). The offset value is preliminarily obtained by the calibration of the magnetic sensors 5a and 5b and stored. Next, the microcomputer 21 calculates Arctan (Y/X) from the X-data and Y-data from which the offset value is subtracted to obtain the azimuth data P12 as digital value (step ST9).

As another method for obtaining the azimuth data, there may be provided a process in which a table for converting values of X-data and Y-data to angle values is provided in the microcomputer 21. The azimuth data P12 is obtained by referring to the table. Although in the second embodiment, the azimuth data P12 as serial data is obtained by performing parallel serial conversion, the present invention is not limited to the process. Namely, there may be provided a process in which the number of terminal electrodes connected to an outside device is increased, so that parallel data of four bits is outputted as the azimuth data.

Since in the magnetic azimuth detecting device 20, the microcomputer 21 for calculating the X-direction magnetic information and the Y-direction magnetic information is integrally mounted, digitized azimuth data are directly output from the magnetic azimuth detecting device 20. Consequently, the portable information equipment on which the magnetic azimuth detecting device is mounted needs not to calculate azimuth data by an inner calculating means, so that the processing load as the system is reduced. Thus, it is possible to provide an information equipment having excellent processing functions as a whole system. Since the processing load as the system is reduced, it is possible to provide an arithmetic calculation means having a low processing function in the portable information equipment, so that the portable information equipment having a long battery life and excellent cost performance is realized.

Although there is provided a two-axis device comprising the magnetic sensor of the X-direction and Y-direction in the first and second embodiments, a three-axis magnetic azimuth detecting device having a Z-direction magnetic sensor may be provided. By the three-axis device, it is possible to detect inclination in a horizontal direction so that azimuth data having higher accuracy may be obtained. Although the magnetic azimuth detecting device of the second embodiment has the independent detecting IC 6 and independent microcomputer 21, the detecting IC 6 and microcomputer 21 may be integrated as one chip IC. In addition, although the microcomputer 21 performs arithmetic calculation and others by a firmware provided therein, hardware by a custom IC may be used instead of the microcomputer.

Figure 12:
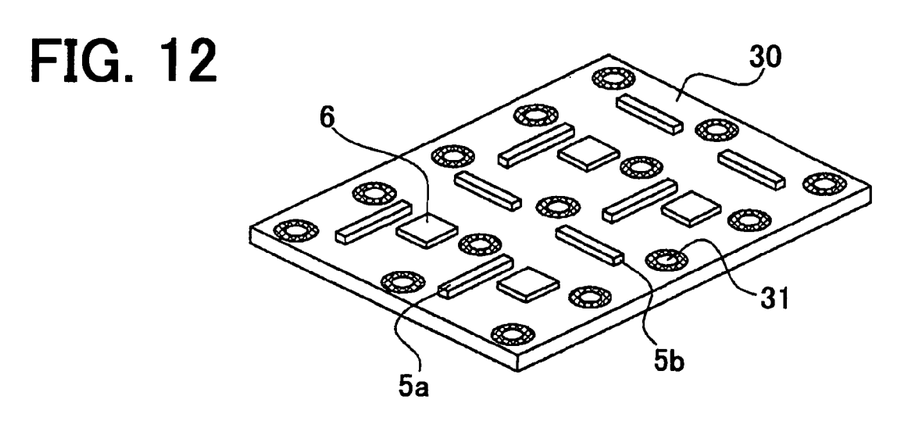
FIGS. 12 to 14 are perspective views showing a method for manufacturing the magnetic azimuth detecting device.
Figure 13:
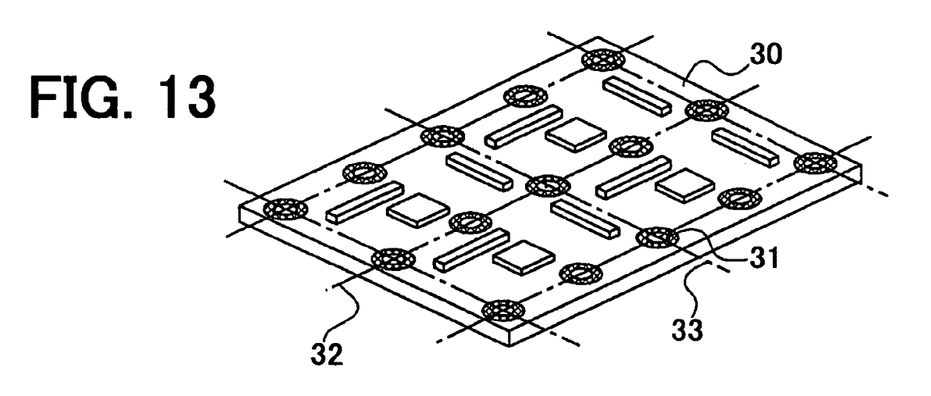

The method for manufacturing the magnetic azimuth detecting device as the third embodiment of the present invention will be described with reference to FIGS. 12 through 14.

There is provided a thin substrate aggregation 30 made of BT resin (bismaleimide triazime resin). The substrate aggregation 30 comprises a plurality of substrate divisions partitioned by dicing lines 32 and 33 as shown in FIG. 13. A plurality of through-holes 31 are provided in the substrate aggregation 30 at intersections of dicing lines 32 and 33 and on the X-direction line 32. Wiring patterns (not shown) are formed on the surface of the substrate aggregation 30 by etching. Electronic parts such as magnetic sensors 5*a* and 5*b* and detecting IC are secured on the substrate aggregation 30 by surface mounting at each of the divisions.

Next, dicing process is carried out on the substrate aggregation 30. Namely, the substrate aggregation 30 is cut off along the X-direction dicing lines 32 and along the Y-direction dicing lines 33.

Figure 14:
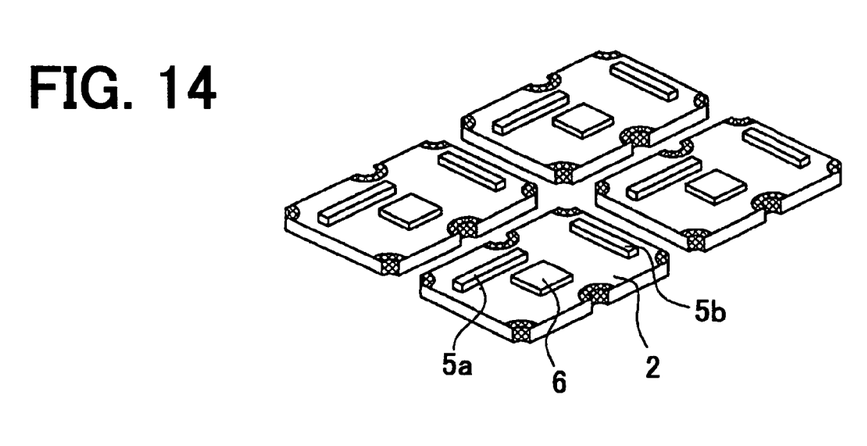

Thus, as shown in FIG. 14, the substrate aggregation 30 is diced into a plurality of circuit substrates 2, each of which having mounted electric parts such as magnetic sensors 5*a* and 5*b* and detecting IC. The upper portion is encapsulated by the encapsulating member 9 (FIG. 2) to complete the magnetic azimuth detecting device of the present invention. The encapsulating member 9 may be supplied before the dicing process. The number of the magnetic azimuth detecting device may be increased more than four pieces. Thus, a plurality of circuit substrate can be produced at the same time, thereby providing the magnetic azimuth detecting device having stable quality by excellent mass production method.

While the invention has been described in conjunction with preferred specific embodiment thereof, it will be understood that this description is intended to illustrate and not limit the scope of the invention, which is defined by the following claims.

What is claimed is:

1. A magnetic azimuth detecting device comprising:
   a generally quadrilateral insulating single substrate having a plane surface;
   plural magnetic sensors provided on the single substrate;
   an IC provided on the single substrate for supplying driving signals to the magnetic sensors so that the magnetic sensors output magnetic information depending on strength of magnetism;
   wherein the plural magnetic sensors and the IC are provided on the plane surface of the single substrate, and an encapsulation member made of resin is provided for encapsulating the magnetic sensors and the IC to integrate the single substrate, the magnetic sensors, and the IC.

2. The magnetic azimuth detecting device according to claim 1 wherein the magnetic sensors are disposed in an X-direction and a Y-direction of the substrate for detecting earth's magnetism in the X-direction and the Y-direction.

3. The magnetic azimuth detecting device according to claim 1 wherein each of the magnetic sensor is a flux-gate sensor having a core made of soft magnetic material.

4. The magnetic azimuth detecting device according to claim 1 wherein the substrate has a plurality of through-holes and terminal electrodes each of which is electrically connected to one of the corresponding through-holes, characterized in that the substrate is electrically connected to an outside substrate by surface mounting through the terminal electrodes.

5. A magnetic azimuth detecting device comprising:
   a generally quadrilateral insulating single substrate having a plane surface;
   plural magnetic sensors provided on the single substrate;
   an IC provided on the single substrate for supplying driving signals to the magnetic sensors so that the magnetic sensors output magnetic information depending on strength of magnetism;
   an arithmetic calculation means provided on the single substrate for calculating azimuth depending on the magnetic information;
   wherein the plural magnetic sensors, the IC, and the arithmetic calculation means are provided on the plane surface of the single substrate, and an encapsulation member made of resin is provided for encapsulating the magnetic sensors, the IC, and the arithmetic calculation means to integrate the single substrate, the magnetic sensors, the IC, and the arithmetic calculation means.

6. The magnetic azimuth detecting device according to claim 5 wherein the magnetic means are disposed in an X-direction and a Y-direction of the substrate for detecting earth's magnetism in the X-direction and the Y-direction.

7. The magnetic azimuth detecting device according to claim 5 wherein each of the magnetic sensor is a flux-gate sensor having a core made of soft magnetic material.

8. The magnetic azimuth detecting device according to claim 5 wherein the substrate has a plurality of through-holes and terminal electrodes, each of which is electrically connected to one of the through-holes, characterized in that the substrate is electrically connected to an outside substrate by surface mounting through the terminal electrodes.

9. A magnetic azimuth detecting device, comprising:
a generally quadrilateral insulating single substrate having a plane surface;
plural magnetic sensors provided on the single substrate;
an IC provided on the substrate for supplying driving signals to the magnetic sensors so that the magnetic sensors output magnetic information depending on strength of magnetism;
wherein the plural magnetic sensors and the IC are provided on the plane surface of the substrate, one of the magnetic sensors is disposed in an X direction and another of the magnetic sensors is disposed in a Y direction on the plane surface of the single substrate, and an encapsulation member made of resin is provided for encapsulating the magnetic sensors and the IC to integrate the substrate, the magnetic sensors, and the IC.

* * * * *